United States Patent
Sasaki (10) Patent No.: US 9,093,577 B2
(45) Date of Patent: Jul. 28, 2015

(54) IMAGE SENSOR AND IMAGE CAPTURE APPARATUS

(71) Applicant: CANON KABUSHIKI KAISHA, Tokyo (JP)

(72) Inventor: Kenichi Sasaki, Yokoahama (JP)

(73) Assignee: Canon Kabushiki Kaisha, Tokyo (JP)

(*) Notice: Subject to any disclaimer, the term of this patent is extended or adjusted under 35 U.S.C. 154(b) by 49 days.

(21) Appl. No.: 13/863,645

(22) Filed: Apr. 16, 2013

(65) Prior Publication Data

US 2013/0270665 A1    Oct. 17, 2013

(30) Foreign Application Priority Data

Apr. 17, 2012  (JP) .................................. 2012-094087
Mar. 18, 2013  (JP) .................................. 2013-055540
Apr. 4, 2013   (JP) .................................. 2013-078690

(51) Int. Cl.
*H01L 31/062*   (2012.01)
*H01L 31/0232*  (2014.01)
*G02B 3/00*     (2006.01)
*H01L 27/146*   (2006.01)

(52) U.S. Cl.
CPC ........ *H01L 31/02325* (2013.01); *G02B 3/0062* (2013.01); *H01L 27/14625* (2013.01); *H01L 27/14627* (2013.01); *H01L 27/14629* (2013.01)

(58) Field of Classification Search
CPC ......................... H01L 27/14627; G02B 3/0062
USPC .................................................. 257/294, 432
See application file for complete search history.

(56) References Cited

U.S. PATENT DOCUMENTS 5,593,913 A  * 1/1997  Aoki ............................... 438/69
2013/0270665 A1* 10/2013  Sasaki .......................... 257/432

FOREIGN PATENT DOCUMENTS

JP            6005829 A    1/1994

* cited by examiner

*Primary Examiner* — Mark Prenty
(74) *Attorney, Agent, or Firm* — Canon USA Inc. IP Division (57) ABSTRACT

In an image sensor in which each microlens of a microlens array is disposed at a position corresponding to each pixel on a side to which light flux is incident, a layer formed of a member different from a member constituting the microlens array is disposed on the side of the microlens array to which light flux is incident, and a surface of the layer formed of the different member has a phase structure optically-opposite to that of the microlens array.

4 Claims, 11 Drawing Sheets

IMAGE SENSOR AND IMAGE CAPTURE APPARATUS

BACKGROUND OF THE INVENTION

1. Field of the Invention

The present invention relates to an image sensor for use in, for example, an image capture apparatus.

2. Description of the Related Art

Recently, in an image sensor for use in an image capture apparatus, such as an electronic camera, has been required to have high sensitivity and high pixel density, which are conflicting features. Further, expanding a condition of a permissible incident angle at an image-plane peripheral portion (where an image height is large) has also been required.

To achieve such a high functional electronic camera, high sensitivity of the image sensor is required so that a shutter can be operated at high speed even under a small light quantity to capture an image with less shake. To realize high sensitivity, it is necessary to efficiently convert the equivalent amount of light reaching the image sensor into an electric signal with lower noise.

On the other hand, to achieve a higher image quality, high pixel density for capturing a high-definition image is being promoted by increasing the number of pixels of the image sensor. Since the size of the image sensor is limited, increasing the number of pixels is achieved by decreasing a pitch between pixels on the image sensor. Accordingly, in order to realize high pixel density, an area size per pixel needs to be reduced.

Recently, the pixel pitch has been already smaller than the diameter of a minimum light spot which can be focused by an imaging lens, depending on an actually-used aperture value. Generally, as an area size per pixel is reduced, the sensitivity of the image sensor deteriorates. A quantity of received light is decreased due to the small pixel area. Further, the area of a photoelectric conversion element (generally called a photodiode, or referred to as a PD), which substantially converts light into electricity in the image sensor, is relatively reduced. The area of the photoelectric conversion element per pixel varies according to the configuration of a sensor such as a charge-coupled device (CCD) sensor or a complementary metal oxide semiconductor (CMOS) sensor. However, generally, the area of the photoelectric conversion element is smaller than the size of one pixel, and only part of a light quantity, which is incident to the area for one pixel, contributes to photoelectric conversion. One means for achieving high sensitivity is to increase the contribution ratio. Since most of light flux incident to the area of one pixel determined by the pixel pitch is propagated in various directions and lost before the light flux is incident from the surface of the image sensor to the inside thereof to reach the photoelectric conversion element, it is not easy to achieve the high sensitivity.

To achieve high sensitivity, in the related art, there has been generally used a method of installing a micro lens (on-chip micro lens, and hereinafter, referred to as a microlens) as a two-dimensional microlens array on the surface of every pixel. The light flux incident to the entire pixel area is further collected in the image sensor by the microlens. In addition, the light flux is collected on a photoelectric conversion element disposed at the innermost portion of the sensor.

Figure 11:
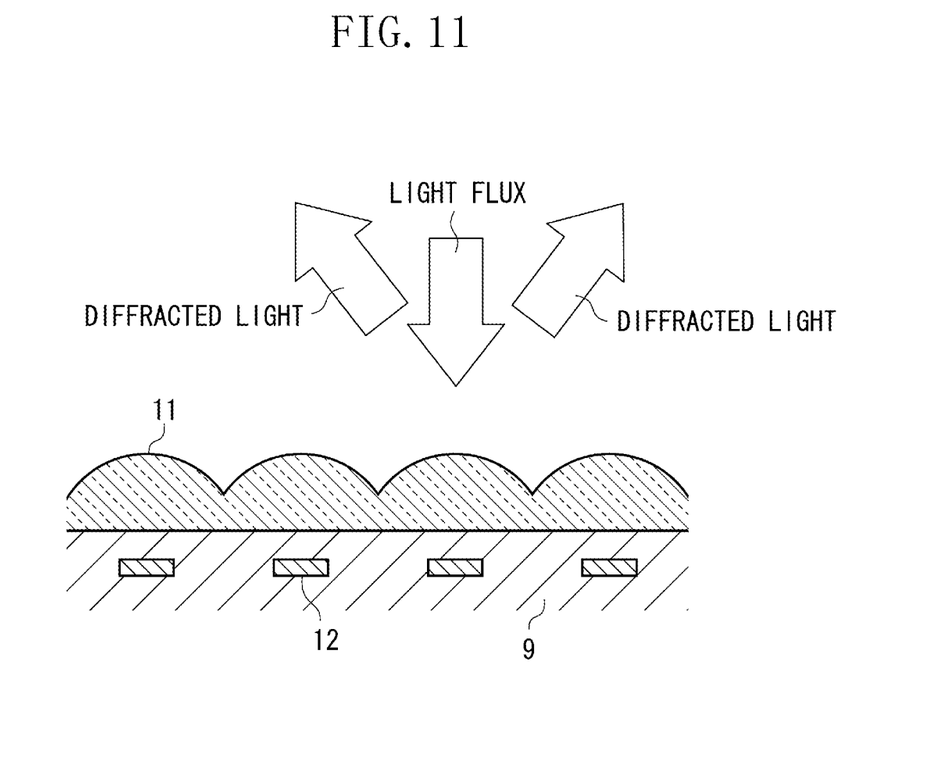
FIG. 11 is a cross-sectional view illustrating an example of a configuration of a conventional image sensor.

The problem in the related art will be described with reference to FIG. 11. As described above, recently, a microlens 11 is provided for each pixel on the image sensor surface. The microlenses 11 are provided periodically corresponding to the pixels, and the microlens 11 has a convex phase structure in the air. Further, a photoelectric conversion unit 12 is also provided, corresponding to each pixel. In addition, reference numeral 9 indicates an internal structure (not illustrated) of the image sensor.

The periodical phase structure serves as a reflect-diffraction grating, and some of the imaging light flux incident to the image sensor surface is diffracted and reflected thereon. In this case, zeroth order reflected light causes a failure as stray light. However, particularly, ±1st-order (and higher order) reflect-diffracted light causes a problem.

The reflect-diffracted light is reflected at a different angle from the angle when being incident to the image sensor by diffraction. Since the reflect-diffracted light is obliquely incident to a diachronic coat of an ultra-violet infrared ray (UVIR) cut filter placed just before the image sensor, the diachronic coat has a characteristic different from a cut wavelength assumed when the diachronic coat is designed.

As a result, some of wavelength components of the diffracted light are reflected by the UVIR cut filter and incident onto the image sensor again to become a ghost image. Some of the diffracted light is reflected and diffracted again from the image sensor and repeatedly reflected between the image sensor and the UVIR cut filter, and has an influence as the ghost in a wide range on the image sensor. The reflect-diffraction ghost is shown as a regular red pattern, when a bright spot exists on the image plane.

In order to reduce an amount of light lost on the microlens surface, Japanese Patent Application Laid-Open No. 6-5829 discusses a transparent film having a lower refractive index than the refractive index of the microlens that is installed on the surface of the microlens. However, this cannot improve the above-described reflect-diffraction ghost.

As a countermeasure for preventing the reflect-diffraction ghost, there is considered a method of decreasing an effect as the diffraction grating by determining an optical height of the microlens. In the case of determining the optical height of the microlens, a method of decreasing the height thereof to make the microlens close to a plane. In the case of decreasing the height thereof by changing a curvature, a substantial optical height may be decreased by increasing not only a radius of curvature but also changing a refractive index of a medium in front of and behind a refractive surface.

However, as a result, refractive power of the microlens is weakened, thereby affecting an effect of improving light collecting efficiency, which is an original objective to install the microlens.

SUMMARY OF THE INVENTION

The present invention is directed to an image sensor capable of reducing a reflect-diffraction ghost without damaging inherent light collecting efficiency of a microlens.

According to an aspect of the present invention, there is provided an image sensor in which each microlens of a microlens array is disposed at a position corresponding to each pixel on a side to which light flux is incident, wherein a layer formed of a member different from a member constituting the microlens array is disposed on the side of the microlens array to which light flux is incident, and wherein a surface of the layer formed of the different member has a phase structure optically-opposite to that of the microlens array.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary

DESCRIPTION OF THE EMBODIMENTS

Various exemplary embodiments, features, and aspects of the invention will be described in detail below with reference to the drawings.

<Configuration of Image Sensor>

Figure 1:
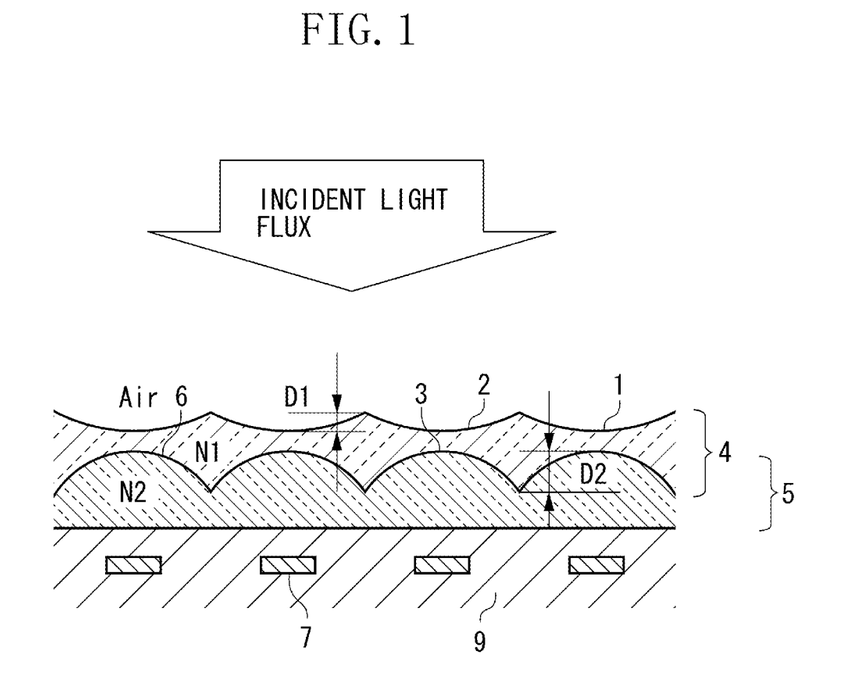
FIG. 1 is a cross-sectional view illustrating a configuration of an image sensor according to a first exemplary embodiment of the present invention.

FIG. 1 illustrates a configuration of an image sensor according to a first exemplary embodiment of the present invention.

A concave microlens array 2 having a concave-lens shape is formed on a sensor surface 1. A compensation layer 4 includes the sensor surface 1 to the next surface 3, and a convex microlens layer 5 includes the surface 3 (at the inner portion) and below. The surface 3 includes a positive microlens array 6 having a convex lens shape.

A refractive index of the compensation layer 4 is N1, and a refractive index of the convex microlens layer 5 is N2.

At the inside of the positive microlens array 6 (when viewed from the surface), an electrode structure and the like (not illustrated) are disposed and a photoelectric conversion unit 7 corresponding to each pixel is disposed. At the periphery of the photoelectric conversion unit 7, an internal structure portion 9 of the image sensor (not illustrated) including a portion transmitting light and a portion not transmitting light is present. The structure portion 9 is represented by an even hatching.

The light flux incident from the sensor surface 1 is first diffused from the concave microlens array 2 having negative power, but converges on the positive microlens array 6 just below the concave microlens array 2 and reaches the photoelectric conversion unit 7.

Since the refractive index N1 of the compensation layer 4 is smaller than the refractive index N2 of the convex microlens layer 5 and a curvature radius of the concave microlens array 2 formed on the sensor surface 1 is smaller than a curvature radius of the positive microlens array 6 therebelow, composite refractive power is configured to become positive power.

While a diffraction ghost light component is reflect-diffracted on the sensor surface 1, a light flux which first passes through the surface and reaches the positive microlens array 6 is reflect-diffracted by the positive microlens array 6 serving as a diffraction grating.

A light component reflect-diffracted from the sensor surface 1 and a diffracted light component reflect-diffracted from the positive microlens array 6 therein have the equivalent amplitude, and phase components thereof interfere with each other to be offset.

Accordingly, a final light collecting effect of the microlens does not deteriorate and a ghost caused due to a reflect-diffraction pattern may be reduced.

That is, in the image sensor where each microlens of the positive microlens array 6 (constituting the microlens array) is disposed at a position corresponding to each pixel at the side to which the light flux is incident, the compensation layer 4 formed of a different member (transparent material) having a periodical phase structure at the same pitch as the convex microlens layer 5 is laminated together with the convex microlens layer 5, and the compensation layer 4 is disposed on the convex microlens layer 5 so that each phase structure is disposed to form the same axis as each microlens. The compensation layer 4 includes at least one layer.

The phase structure of the compensation layer 4 is configured to have an optically reverse phase with respect to a diffraction grating structure by the convex microlens layer 5.

Since the phase structure of the compensation layer 4 has the same pitch as the microlens, even in the phase structure of the compensation layer 4, reflect-diffracted light is generated at the same diffractive angle as that of the convex microlens layer 5. The reflect-diffracted light interferes with the diffracted light component from the convex microlens layer 5 and serves to reduce intensity of the diffracted light component.

There are considered a case where the periodic phase structure of the compensation layer 4 has refractive power (that is, microlens) and a case where the periodic phase structure does not have the refractive power. When the periodic phase structure has the refractive power, composite refractive power with the microlens is configured to realize desired light collecting efficiency.

However, when a refractive index of the compensation layer 4 of a side contacting air is N1, and a refractive index of the next convex microlens layer 5 is N2, N1>N2 is set.

Intensity reflectance R1 on an interface with air is obtained by the following equation (1).

$$R1 = \{(N1-1)/(N1+1)\}^2 \qquad (1)$$

In addition, intensity reflectance R2 on an interface with the next layer 5 is obtained by the following equation (2).

$$R2 = \{(N2-N1)/(N2+N1)\}^2 \qquad (2)$$

It is desirable that intensity of a reflected component on the interface obtained when the light is incident to the compensation layer 4 of the sensor surface 1 in the air is substantially equivalent to the intensity obtained when a reflected component, while the light is incident to the interface with the next convex microlens layer 5, is emitted in the air.

The ratio of 1st-order intensity diffracted light in the entire intensity of reflective light at a surface is set as diffraction efficiency of the 1st-order diffracted light.

Further, when diffraction efficiency of 1st-order diffract-reflected light on the sensor surface 1 is d1, diffraction efficiency of the 1st-order diffract-reflected light on an interface with the next convex microlens layer 5 is d2, if intensity of incident light to the sensor surface 1 is I0, intensity Id1 of 1st-order diffract-reflected light component from the sensor surface 1 is obtained by the following equation (3).

$$Id1 = I0 \cdot R1 \cdot d1 \quad (3)$$

Intensity Id2 of the 1st-order diffract-reflected light component from the next interface is obtained by the following equation (4).

$$Id2 = I0 \cdot (1-R1) \cdot (1-R1) \cdot R2 \cdot d2 \quad (4)$$

Further, since an optical distance (thickness) of each layer is short, an effect of transmission diffraction is not considered.

The respective reflect-diffracted light components from the sensor surface 1 and the next positive microlens array 6 have the same intensity to be attenuated by each other. Since the condition is Id1=Id2, equation (5) is obtained.

$$I0 \cdot R1 \cdot d1 = I0 \cdot (1-R1) \cdot (1-R1) \cdot R2 \cdot d2 \quad (5)$$

Since optical depths of gratings in two layers 4 and 5 are set to be the same, diffraction efficiencies can be similar to each other. This will be described below, but when the diffraction efficiencies of the two layers 4 and 5 are d1=d2, the following equation (6) is obtained.

$$R1 = (1-R1) \cdot (1-R1) \cdot R2 \quad (6)$$

A condition of a refractive index between the two layers 4 and 5 is represented by the following equation (7).

$$\{(N1-1)/(N1+1)\}^2 = [1-\{(N1-1)/(N1+1)\}^2]^2 \cdot \{(N2-N1)/(N2+N1)\}^2 \quad (7)$$

When a phase structure of an incident side of the sensor surface 1, that is, a surface contacting air serves as a diffraction grating, the grating depth, which is actually measured, is D1. Further, when an actually-measured grating depth of the phase structure disposed on a boundary between the layer 4 having the refractive index N1 and the layer 5 having the refractive index N2 is D2, the following equation (8) is obtained.

$$D1 = D2/N1 \quad (8)$$

In this case, in a converted light path length, the depths of two diffraction gratings are equivalent to each other.

Based on the above conditions, N1, N2, D1, and D2 need to satisfy conditions of the following equations (9) and (10).

$$\{(N1-1)/(N1+1)\}^2 - [1-\{(N1-1)/(N1+1)\}^2]^2 \cdot \{(N2-N1)/(N2+N1)\}^2 < 0.04 \quad (9)$$

$$0.8 \le (D1 \cdot N1)/D2 \le 1.20 \quad (10)$$

Further, when the optical depth is referred to as a "thickness", since only the phase difference is considered, the above D1=D2/N1 may be expressed by the following equation (11).

$$D1 = D2/N1 + n \cdot \lambda \quad (11)$$

(n=1, 2, 3, . . . , and λ: predominant red wavelength (in the air) of ghost)

If n is within a certain range, the same effect as described above may be obtained. In other words, the case where n=1 is the aforementioned example. However, when n is too large, the effect is gradually weakened. Accordingly, for example, n may be less than 10.

<Configuration of Camera>

Next, a configuration of an image capture apparatus such as a digital camera according to the exemplary embodiment will be described.

Figure 2:
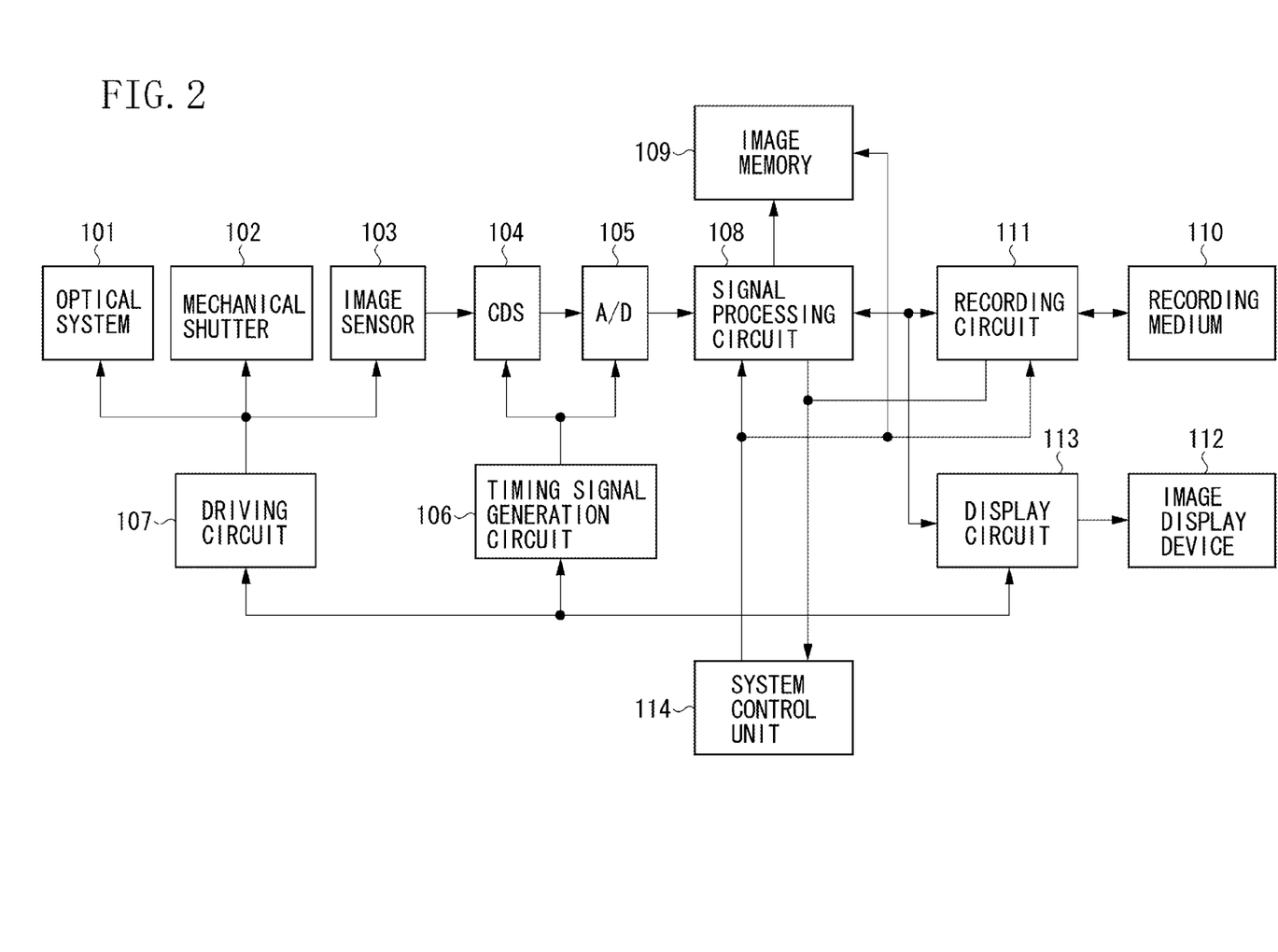
FIG. 2 illustrates a block diagram of an image capture apparatus.

FIG. 2 illustrates a block diagram of an image capture apparatus according to the present exemplary embodiment. The image capture apparatus includes an optical system 101 constituted by a lens and an aperture, a mechanical shutter 102, and an image sensor 103 such as a CCD sensor or a CMOS sensor, which is an image capture element. Further, the image capture apparatus includes a circuit 104 such as a correlated double sampling (CDS) circuit for performing analog signal processing, an analog-digital converter 105 for converting an analog signal into a digital signal, and a timing signal generation circuit 106 for generating a timing signal, which operates the image sensor 103, the CDS circuit 104, and an analog/digital (A/D) converter 105. Further, the image capture apparatus includes a driving circuit 107 of the optical system 101, the mechanical shutter 102, and the image sensor 103, a signal processing circuit 108 for performing signal processing required for captured image data, and an image memory 109 for storing the signal-processed image data. Further, the image capture apparatus includes an image recording medium 110, which is detachable from the image capture apparatus, a recording circuit 111 for recording the signal-processed image data on the image recording medium 110, an image display device 112 for displaying the signal-processed image data, and a display circuit 113 for displaying the image on the image display device 112. Further, the image capture apparatus includes a system control unit 114 controlling the entire image capture apparatus, and a nonvolatile memory (read only memory (ROM)) 115 for storing a program in which a control method executed in the system control unit 114 is written, control data such as a parameter or a table used when executing the program, and correction data such as a defect address. Further, the image capture apparatus includes a volatile memory (random access memory (RAM)) 116 which receives and stores the program, the control data, and the correction data stored in the nonvolatile memory 115 and uses the stored program and data when the system control unit 114 controls the image capture apparatus.

<Image Capturing Control>

Hereinafter, an image-capturing operation using the mechanical shutter 102 by using the image capture apparatus constituted as described above will be described. Further, the image-capturing operation is controlled by a command of the system control unit 114, unless particularly specified.

First, before the image-capturing operation, the system control unit 114 transmits and stores a necessary program, control data, and correction data from the nonvolatile memory 115 to the volatile memory 116 according to power supplied to the image capture apparatus. Further, the program or the data is used when the system control unit 114 controls the image capture apparatus. In addition, the system control unit 114 transmits an additional program or data from the nonvolatile memory 115 to the volatile memory 116, or directly reads and uses the data in the nonvolatile memory 115, if necessary.

The optical system 101 drives the aperture and the lens by the control signal from the system control unit 114 to form an object image set to have appropriate brightness on the image sensor 103. Next, the mechanical shutter 102 is driven to shield the image sensor 103 according to an operation of the image sensor 103 to secure a necessary exposure time by the control signal from the system control unit 114. In this case, when the image sensor 103 has an electronic shutter function, the image sensor 103 may be used together with the mechanical shutter 102 to secure a required exposure time. The image sensor 103 is driven by a drive pulse based on an operation pulse, which is generated by the timing signal generation circuit 106 controlled by the system control unit 114, and converts the object image into an electric signal by the photoelectric conversion to output the converted electric signal as an analog image signal. The analog image signal output from the image sensor 103 is converted into a digital image signal in the A/D converter 105 after removing a clock-synchronous noise in the CDS circuit 104 by the operation pulse, which is generated by the timing signal generation circuit 106 controlled by the system control unit 114.

Next, in the signal processing circuit 108 controlled by the system control unit 114, image processing such as color conversion, white balance, gamma correction, resolution conversion, and image compression are performed with respect to the digital image signal. The image memory 109 is used to store temporarily the digital image signal during signal processing or store image data which is the signal-processed digital image signal. The signal-processed image data in the signal processing circuit 108 or the image data stored in the image memory 109 is converted into data (for example, file system data having a hierarchical structure) suitable for the image recording medium 110 in the recording circuit to be recorded in the image recording medium 110, or converted into a signal (for example, an National Television Standard Committee (NTSC) type analog signal and the like) suitable for the image display device 112 in the display circuit 113 to be displayed on the image display device 112, after the resolution conversion is performed in the signal processing circuit 108.

Here, in the signal processing circuit 108, the signal processing is not performed by the control signal from the system control unit 114, but the digital image signal may be output to the image memory 109 or the recording circuit as the image data as it is. Further, when there is a request from the system control unit 114, the signal processing circuit 108 outputs information on the digital image signal or the image data generated during the signal processing, for example, information on a spatial frequency of the image, an average value of a designated area, a data amount of the compressed image, and the like or information extracted therefrom, to the system control unit 114. In addition, when there is a request from the system control unit 114, the recording circuit outputs information on the kind of image recording medium 110, free capacity, or the like, to the system control unit 114.

Further, a reproduction operation performed when the image data is recorded in the image recording medium 110 will be described. The recording circuit reads the image data from the image recording medium 110 by the control signal from the system control unit 114, and similarly, the signal processing circuit 108 performs image expansion processing to store the expanded image in the image memory 109 by the control signal of the system control unit 114 when the image data is the compressed image. The image data stored in the image memory 109 is converted into a signal suitable for the image display device 112 in the display circuit 113 to be displayed on the image display device 112 after the resolution conversion is performed in the signal processing circuit 108.

<Flow of Processing in Image Capture Apparatus>

Hereinafter, the image capture apparatus commonly has the following processing flow.

Figure 3:
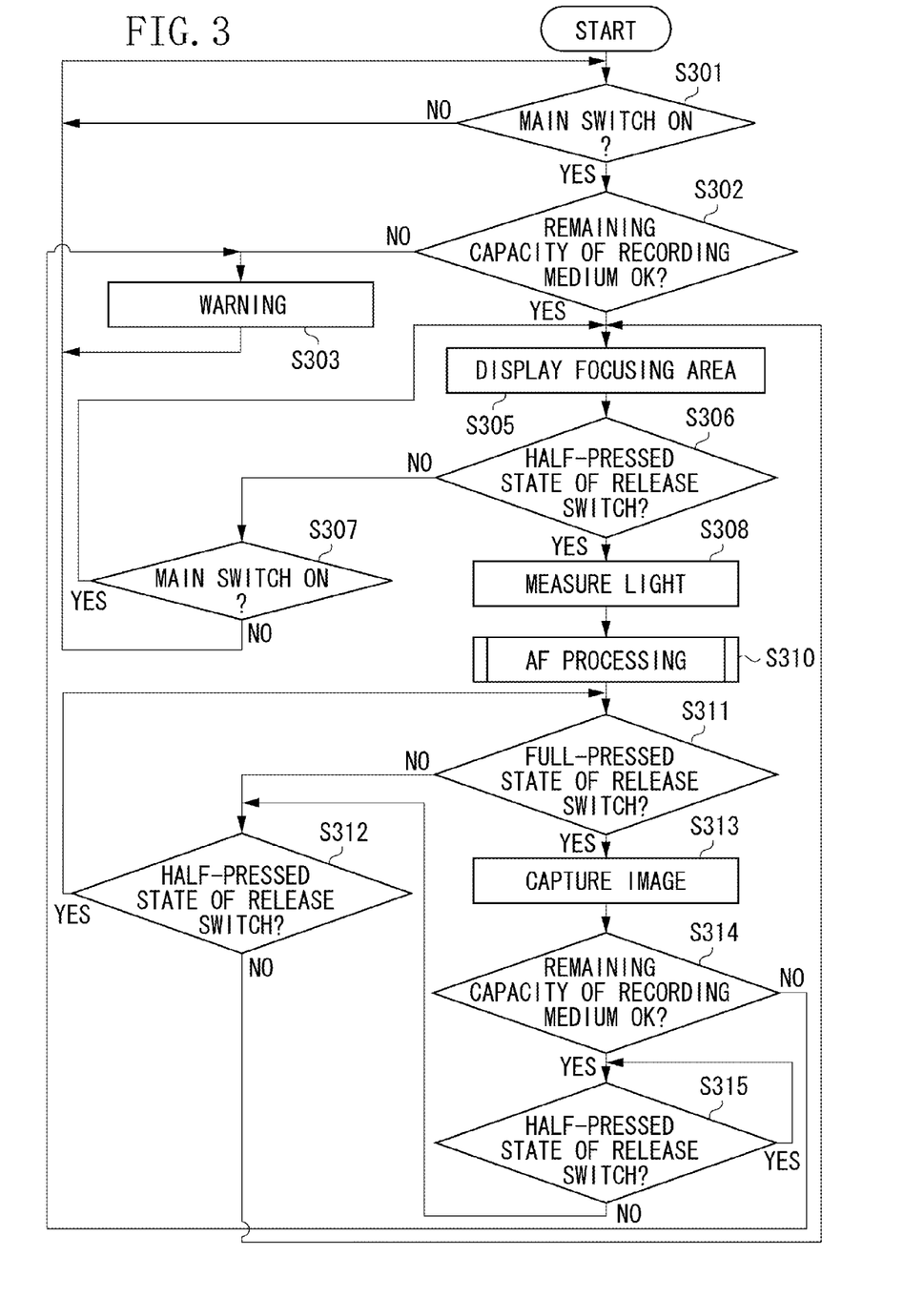
FIG. 3 is a diagram illustrating an entire flow of image capture processing.

The overall processing flow during image capturing will be described with reference to a flowchart illustrated in FIG. 3. When there is no particular mention in the following description, a subject of the operation is the system control unit 114 (illustrated in FIG. 2).

First, in step S301, the system control unit 114 detects the state of a main switch (power switch) (not illustrated) included in an operation unit (not illustrated), and when the main switch is turned on, the process proceeds to step S302.

In step S302, the system control unit 114 checks a remaining capacity of the recording medium installed on the recording circuit 111 (illustrated in FIG. 2), and for example, if the remaining capacity is larger than a size of captured image data defined from image quality setting and the like, the process proceeds to step S305. If not, the process proceeds to step S303.

In step S303, the system control unit 114 warns that the remaining capacity of the recording medium is insufficient, and then the process returns to step S301. The warning may be performed by displaying a message on the image display device 112 (illustrated in FIG. 2), outputting a voice from a voice output unit (not illustrated), or displaying the message and outputting the voice.

In step S305, the system control unit 114 displays a focusing area (also referred to as an auto focus (AF) area) on the image display device 112. That is, in continuous display processing in which the captured image is stored in the image memory 109 (illustrated in FIG. 2) which is a temporary storing unit and the display image is generated by the display circuit 113 (illustrated in FIG. 2) to be displayed on the image display device 112, an AF area set in general image capturing is displayed together.

In step S306, the system control unit 114 checks the state of a release switch, and if the release switch is in a half-pressed state, the process proceeds to step S308 and if not, the process proceeds to step S307. Here, the image capture apparatus according to the exemplary embodiment starts pre-processing before image capturing, such as an auto focus (AF) operation or an auto exposure (AE) operation according to the half-pressed state of the release switch. In step S307, the state of the main switch is checked, and if the main switch is turned on, the process returns to step S305, and if not, the process returns to step S320.

In step S308, the system control unit 114 detects luminance of the object from output of the A/D converter 105 (illustrated in FIG. 2).

Thereafter, in step S310, auto focusing processing (AF processing) is performed. When the luminance of the object is lower than a predetermined value from the detected result in step S308, the AF processing is performed by transmitting an AF auxiliary light to the object for a predetermined time by a light source (not illustrated).

Further, when the focusing is performed, in step S311, the system control unit 114 checks whether the release switch (not illustrated) is in a full-pressed state, and if the release switch is in the full-pressed state, the process proceeds to step S313 and if not, the process proceeds to step S312. Here, in the image capture apparatus of the exemplary embodiment, the image capturing starts by the full press of the release switch.

In step S312, the system control unit 114 checks whether the release switch is in a half-pressed state, and if the release switch is in the half-pressed state, the process proceeds to step S311 and if not, the process proceeds to step S305. In step S314, similarly to step S302, the system control unit 114 checks the remaining capacity of the recording medium, and if the capacity required for the next image capturing remains, the process proceeds to step S315 and if not, the process proceeds to step S303. In step S315, the system control unit 114 checks whether the release switch is in the full-pressed state, and if the release switch is not in the full-pressed state, the process proceeds to step S312.

<Manufacturing Method>

A manufacturing method of the image sensor described with reference to FIG. 1 will be described. A manufacturing method of a micro lens array includes various methods, for example, a reflow method of forming a micro lens shape through melting, an etch back method, or other manufacturing processes.

The image sensor described with reference to FIG. 1 is manufactured by for example, forming the microlens array for inherently collecting light and further loading a transparent member thereon, and thereafter processing a surface structure to be a desired optical phase structure. In the case of the reflow method, a material is interposed between the pixels in advance so that positions of the concave and convex are opposite to each other and then the center of the pixel is dented by melting the material. With respect to the microlens array for collecting light, a layer having a spatially-reverse phase structure in the image sensor surface is formed. In the case of the etch back method, etching may be performed to directly have a desired shape.

Figure 4:
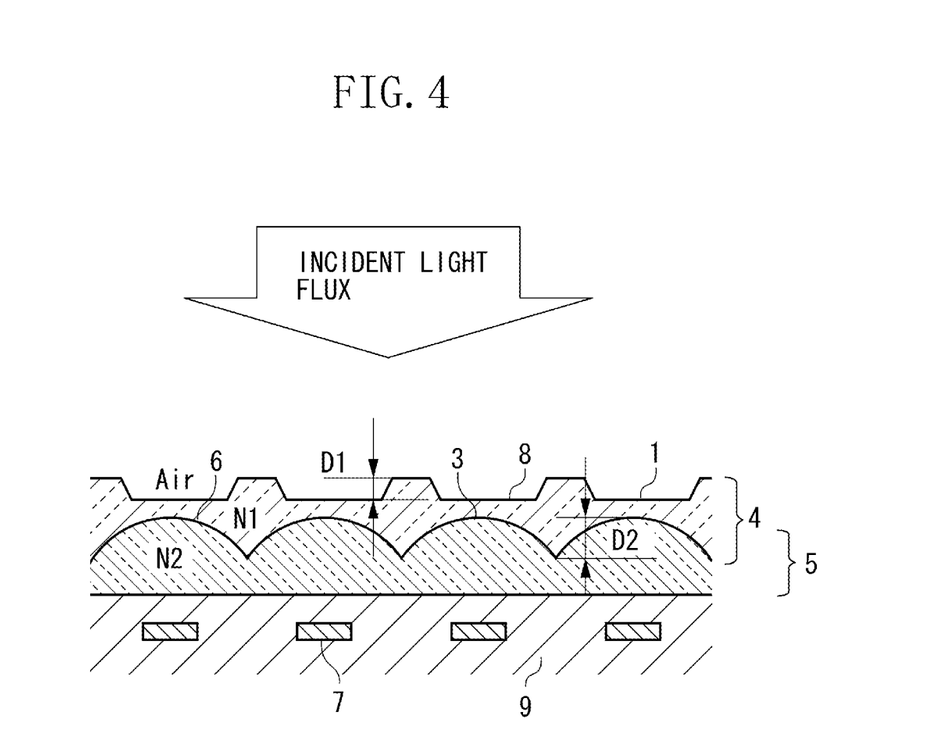
FIG. 4 is a cross-sectional view illustrating a configuration of an image sensor according to a second exemplary embodiment of the present invention.

FIG. 4 illustrates a configuration of an image sensor according to a second exemplary embodiment of the present invention.

A basic configuration is the same as that of the first exemplary embodiment, but the second exemplary embodiment is different from the first exemplary embodiment in that the first exemplary embodiment has the concave microlens structure having negative power on the sensor surface 1, while the second exemplary embodiment does not have power in the phase structure of the sensor surface 1.

On the sensor surface 1, a grating-shaped array 8 having a cross-sectional shape of a trapezoid or rectangle with an opposite phase structure to the shape of the positive microlens array 6 therein is formed.

A compensation layer 4 includes the sensor surface 1 to the next surface 3, and a convex microlens layer 5 includes the surface 3 (at the inner portion) and below. The surface 3 includes a positive microlens array having a convex lens shape.

A refractive index of the compensation layer 4 is N1, and a refractive index of the convex microlens layer 5 is N2.

At the inside of the positive microlens array 6 (when viewed from the surface), an electrode structure (not illustrated) and the like are disposed and a photoelectric conversion unit 7 corresponding to each pixel is disposed.

The light flux incident from the sensor surface 1 passes through the surface, converges on the positive microlens array 6 just below the surface, and reaches the photoelectric conversion unit 7.

Since the phase structure of the sensor surface 1 does not have power, the light flux is not diffused, but receives only a light-collecting effect by the positive microlens array 6.

While a diffraction ghost light component is reflect-diffracted on the sensor surface 1, a light flux which first passes through the surface and reaches the surface 3 of the convex microlens layer 5 is reflected and diffracted by the surface 3 serving as a diffraction grating.

A light component reflected and diffracted from the sensor surface 1 and a diffracted light component reflected and diffracted from the inner surface 3 have the equivalent amplitude, and phase components thereof interfere with each other to be offset.

In general, when an incident condition to the image sensor deviates from a telecentric, light is obliquely incident at an image plane peripheral portion. As a result, as compared with a case where the light is vertically incident, an effective diffraction grating depth is changed. Accordingly, based on a light incident angle at the image plane peripheral portion, a position of the diffraction grating of the surface needs to be shifted by considering a variation of the depth or considering a shift of the microlens. Thus, a third exemplary embodiment of the present invention will be described with reference to FIG. 5.

Figure 5:
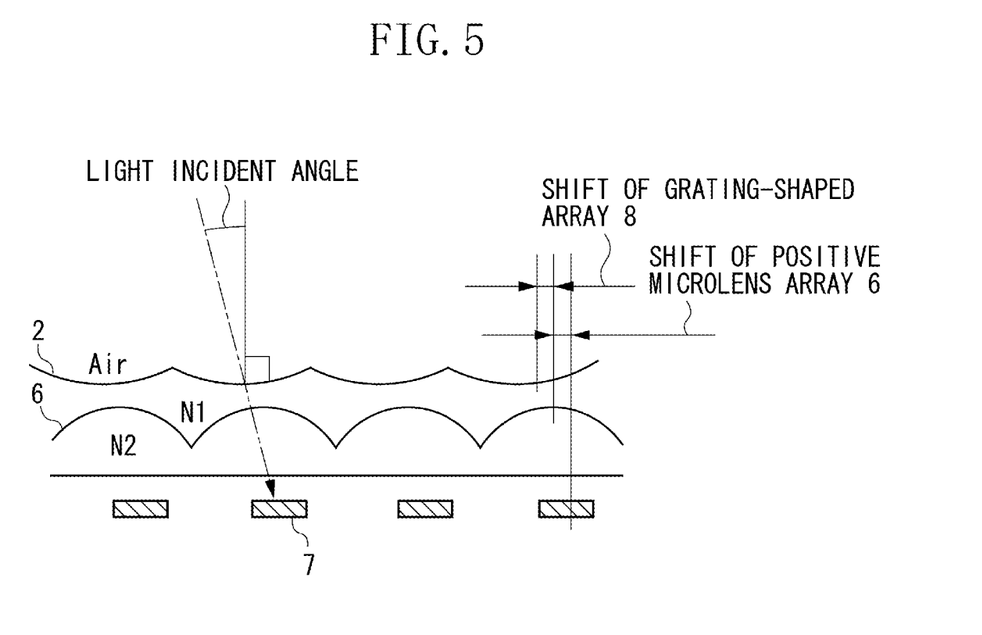
FIG. 5 is a diagram illustrating an image sensor according to a third exemplary embodiment of the present invention.

As described above, in the case of an imaging optical system, the light flux is almost vertically incident to the image sensor at an image plane central portion, while a telecentric state deteriorates at the image plane peripheral portion when the incidence condition to the image sensor is changed. In this case, even in the case of the positive microlens array 6 exists, the light flux is obliquely incident to incorrectly contact the photoelectric conversion unit 7, and as a result, coupling efficiency of a light amount deteriorates at the image plane periphery. Therefore, positions of the positive microlens array 6 and the photoelectric conversion unit 7 are to be relatively misaligned. Here, the microlens corresponding to the image plane peripheral portion is shifted. The microlens may be shifted based on any position or may be shifted by an image height increased by deviating from an optical axis. The latter has a higher effect. As a result, the light incident to the sensor at an incident angle may be efficiently coupled with the photoelectric conversion unit.

Specifically, when the concave microlens array 2 of the compensation layer 4 having the phase structure formed on the image sensor surface is disposed at the same position as the positive microlens array 6, a distance between the concave microlens array 2 and the positive microlens array 6 is formed by a thickness of the compensation layer 4. Accordingly, some of the light flux incident to the positive microlens array 6 interferes with a convex portion of the concave microlens array 2 and is to be lost. Therefore, if the concave microlens array 2 is not shifted, the concave microlens array 2 interferes with the light flux, which is incident at a predetermined angle, similarly to the positive microlens array 6.

Therefore, for example, a shift amount of the concave microlens array 2 is set so that the light at the image height is positioned in a range in which corresponding one concave microlens, one convex microlens, and the photoelectric conversion unit 7 are connected to each other on a straight line, or near the range by considering a shift amount of the microlens of the positive microlens array 6, the compensation layer 4, and the light incident angle.

Since the positions of the reflect-diffracted light from the concave microlens array 2 and the positive microlens array 6 are not changed even if the concave microlens array 2 and the positive microlens array 6 deviate from each other in the image sensor surface, the positions does not influence the effect.

Next, a fourth exemplary embodiment of the present invention, which is an application example of the image sensor described in the second exemplary embodiment, will be described with reference to FIG. 6 and with the issue described in the third exemplary embodiment.

Figure 6:
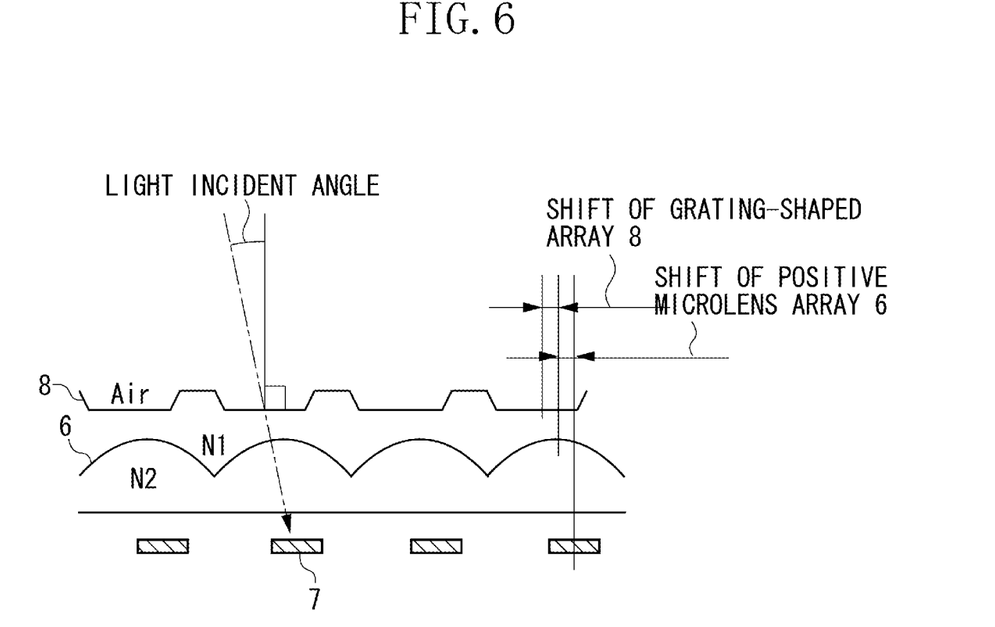
FIG. 6 is a diagram illustrating an image sensor according to a fourth exemplary embodiment of the present invention.

As illustrated in FIG. 6, in the grating-shaped array 8 of the compensation layer 4 having the phase structure formed on the image sensor surface, some of the light flux incident to the positive microlens array 6 interferes with the convex portion of the grating-shaped array 8 and is to be lost. When the grating-shaped array 8 is disposed at the same position as the positive microlens array 6, a distance by a thickness of the compensation layer 4 is formed between the grating-shaped array 8 and the positive microlens array 6. Therefore, if the grating-shaped array 8 is not shifted, the grating-shaped array 8 interferes with the light flux, which is incident at a predetermined angle, similarly to the positive microlens array 6.

Therefore, a shift amount of the grating-shaped array 8 is set so that the light at the image height is positioned in a range in which corresponding one grating shape, one convex microlens, and the photoelectric conversion unit 7 which correspond to the grating-shaped array 8 are connected to each other on a straight line, or near the range by considering a shift amount of the microlens of the positive microlens array 6, the compensation layer 4, and the light incident angle.

Since the positions of the reflect-diffracted light from the grating-shaped array and the positive microlens array 6 are not changed even if the grating-shaped array and the positive microlens array 6 deviate from each other in the image sensor surface, the positions does not influence the effect.

Figure 8:
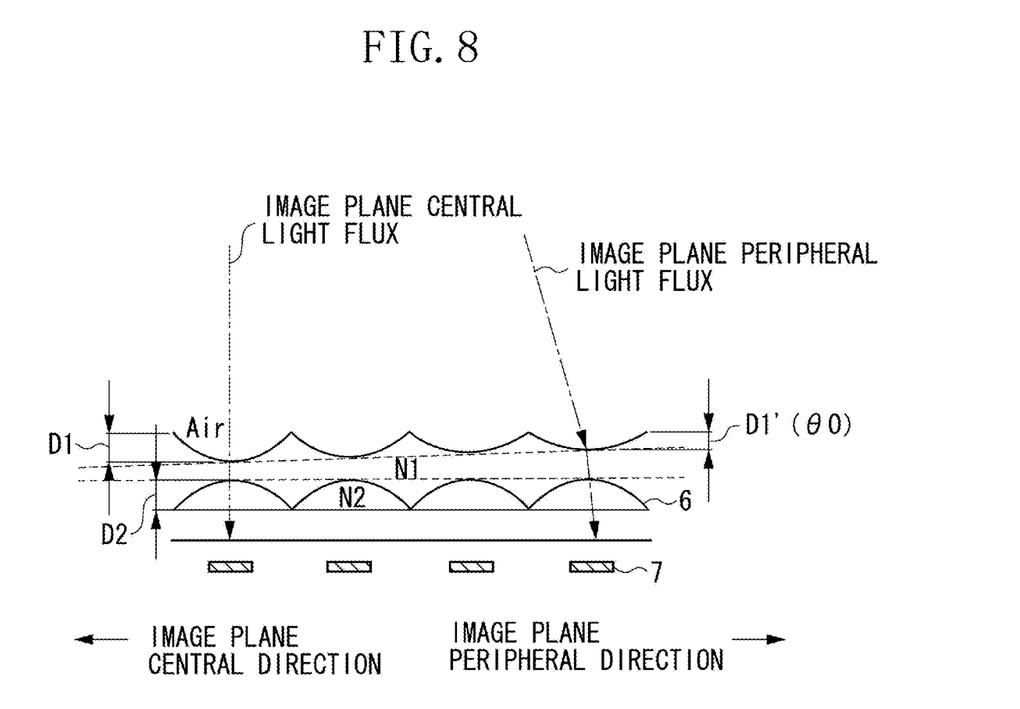
FIG. 8 is a diagram illustrating an image sensor according to the fifth exemplary embodiment of the present invention.

Next, a fifth exemplary embodiment of the present invention, which is a solution example by the technical spirit of an aspect different from the technical spirit described in the fourth exemplary embodiment, will be described with reference to FIG. 8 and with the issue described in the third exemplary embodiment.

First, a case where the light flux is almost vertically incident to the image sensor at an image plane central portion while the incidence condition to the image sensor is changed at the image plane peripheral portion will be described with reference to FIG. 7.

That is, this is a case of an imaging optical system in which a telecentric state slightly deteriorates at an image side. When heights of the microlenses are uniform at the image plane center and the image plane periphery, since the light is vertically incident at the center while the light is obliquely transmitted at a light incident angle at the periphery, an optical path length is increased as a secant component thereof. As a result, optical depths as a diffraction grating are different from each other, and the diffraction efficiency may vary at the image plane center and the image plane periphery. For this reason, reflect-diffraction ghosts generated when high light flux is incident to the image plane center is also different from the ones generated when the high light flux is incident to the image plane periphery.

Meanwhile, there is the similar influence on the concave microlens array 2 installed on the image sensor surface, and since the optical depths are different at the image plane periphery, similarly, diffraction efficiency varies. As a result, amplitudes of the reflect-diffraction ghost due to the positive microlens array 6 and the reflect-diffraction ghost due to the concave microlens array 2 on the surface are different at the image plane center and the image plane periphery, and a condition in which the amplitudes are not sufficiently offset may occur at the periphery.

Figure 7:
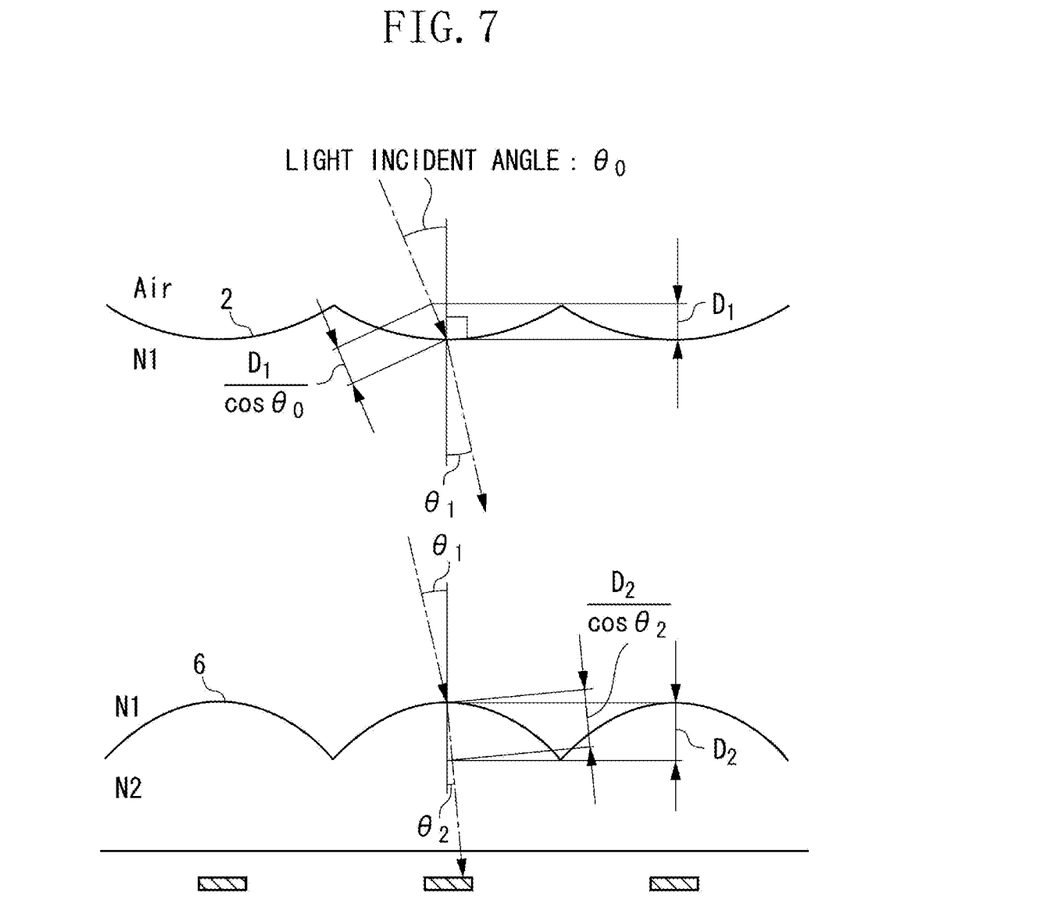
FIG. 7 is a diagram illustrating a case where an incidence condition to an image sensor is changed according to a fifth exemplary embodiment of the present invention.

FIG. 7 is a schematic diagram in an image height at the periphery where an incident angle of the image sensor is $\theta 0$. For the purpose of description, a distance between the concave microlens array 2 and the positive microlens array 6 is larger than an actual distance.

Here, $\theta 0$ is an incident angle of light which is emitted from an imaging lens at the image height to be incident to the image sensor, and when the light is incident to the center of a pixel of the concave microlens array 2, an angle of light after passing through the concave microlens array 2 is $\theta 1$. $\theta 1$ is represented by the following equation (12).

$$\sin \theta 0 = N1 \cdot \sin \theta 1 \quad (12)$$

Further, after passing through the concave microlens array 2, an angle $\theta 2$ passing through the pixel center of the positive microlens array 6 is similarly represented by the following equation (13).

$$N1 \cdot \sin \theta 1 = N2 \cdot \sin \theta 2 \quad (13)$$

When the light is incident to both the concave microlens array 2 and the positive microlens array 6 at a predetermined angle, heights (depths) D1 and D2, which are related with the optical path length providing a phase difference generated when the concave microlens array 2 and the positive microlens array 6 serve as the reflect-diffraction grating, are influenced by incident angles to be substantially increased, as represented by the following equation (14).

$$\frac{D1}{\cos \theta 0} \quad (14)$$
$$\frac{D2}{\cos \theta 2}$$

A light incident angle $\theta 0$ on the image plane beyond a telecentric condition varies according to a design of the imaging lens. In general, the light is incident to the image sensor at 0°, that is, vertically at the image plane center, and as the image height is increased, the light incident angle may be slowly changed at a constant mark in many cases. That is, in the image sensor, an image may be enlarged or reduced while increasing a distance from the image sensor and expanding from the center to the outer periphery. In many cases, an image is enlarged with a wide-angle lens, and an image is reduced with a telephoto lens.

Further, as described above, as the image height is increased, since the light incident angle is monotonously changed in many cases, an end portion of the image plane may have the largest incident angle in many cases.

However, as the image height is increased, a change of the incident angle may be reversed.

As a result, as compared with the image plane center, substantial heights (depths) of the concave microlens array 2 and the positive microlens array 6 are changed toward the end portion of the image plane. Accordingly, the condition for offsetting of the diffractive ghost is accurate at the center, but the condition may be inaccurate at the periphery, and as a result, the offset of the diffractive ghost may not be sufficiently performed.

Further, in respective interfaces of the concave microlens array 2 and the positive microlens array 6, differences in a refractive index are different from each other, and vary according to a material. Generally, the difference in a refractive index on the interface of the concave microlens array 2 from air to a medium is larger than that of the positive microlens array 6. As a result, according to a variation of the incident angle, a change of a converted optical path length caused due to oblique incidence has a larger effect on the interface of the concave microlens array 2 than on the interface of the positive microlens array 6.

Accordingly, the technical spirit for solving the problem will be described with reference to FIG. 8.

The offset of the diffractive ghost is effectively achieved at any place of the image plane, by changing the D1 and D2 according to a change of the light incident angle from the center to the periphery. As the light reaches the image plane periphery, as illustrated in FIG. 8, the light incident angle is made in a direction in which the image is expanded.

In this case, as the light incident angle is increased, a phase difference (height or depth) as a diffraction grating of the concave microlens array 2 is increased as a substantial converted optical path length. Accordingly, in order to correct the phase difference, the phase difference is set to a smaller value than the height D1 as an actual dimension. In this case, the height of the concave microlens array 2 is represented by D1'. In FIG. 8, since D1' depends on the incident angle $\theta 0$, the height of the concave microlens array 2 is represented by as D1'($\theta 0$).

Here, D2 is constant regardless of the image height. The reason is that the incident angle θ1 is close to vertical incidence to some degree on the interface of the positive microlens array 6 because light is refracted and incident in the transparent medium from air on the interface of the concave microlens array 2, and the positive microlens array 6 improves coupling efficiency of the incident light flux as an inherent object.

Here, in an image height at the center and the periphery of the light incident angle θ0, in order to equalize a reduction effect of the diffractive ghost, the depth ratio of the diffraction grating may be set to be equal to the ratio of D1 and D2 at the center.

As the condition, equation (15) is required.

$$D1:D2 = \frac{D1'}{\cos\theta 0} : \frac{D2}{\cos\theta 2} \quad (15)$$

Since equation (16) is $\sin\theta 0 = N2 \cdot \sin\theta 2$ (16), the height D1'(θ0) of the concave microlens array 2 at the periphery is represented by the following equation (17), as a function depending on θ0.

$$D1'(\theta 0) = D1 \cdot \frac{\cos\theta 0}{\sqrt{1-\frac{\sin^2\theta 0}{N2^2}}} \quad (17)$$

When the condition equation is configured to be satisfied in the range of ±3%, a sufficient effect may be obtained.

Further, in the example, D2 is set to the constant height on the entire image plane, but may be changed according to the image height, similarly to D1.

In addition, the diffractive ghost has a larger effect at a wide angle side. This is because the light source is easy to be captured small on the image plane. As a result, in the case where the light incident angle is changed when a zoom lens moves from a wide-angle end to a telephoto end, it is suitable to prioritize a condition of the light incident angle at the wide-angle side. Even if the condition is not necessarily set based on the wide-angle end, the condition may be averagely set within the range to be easily influenced in the range from the wide angle to the telephoto.

Figure 9:
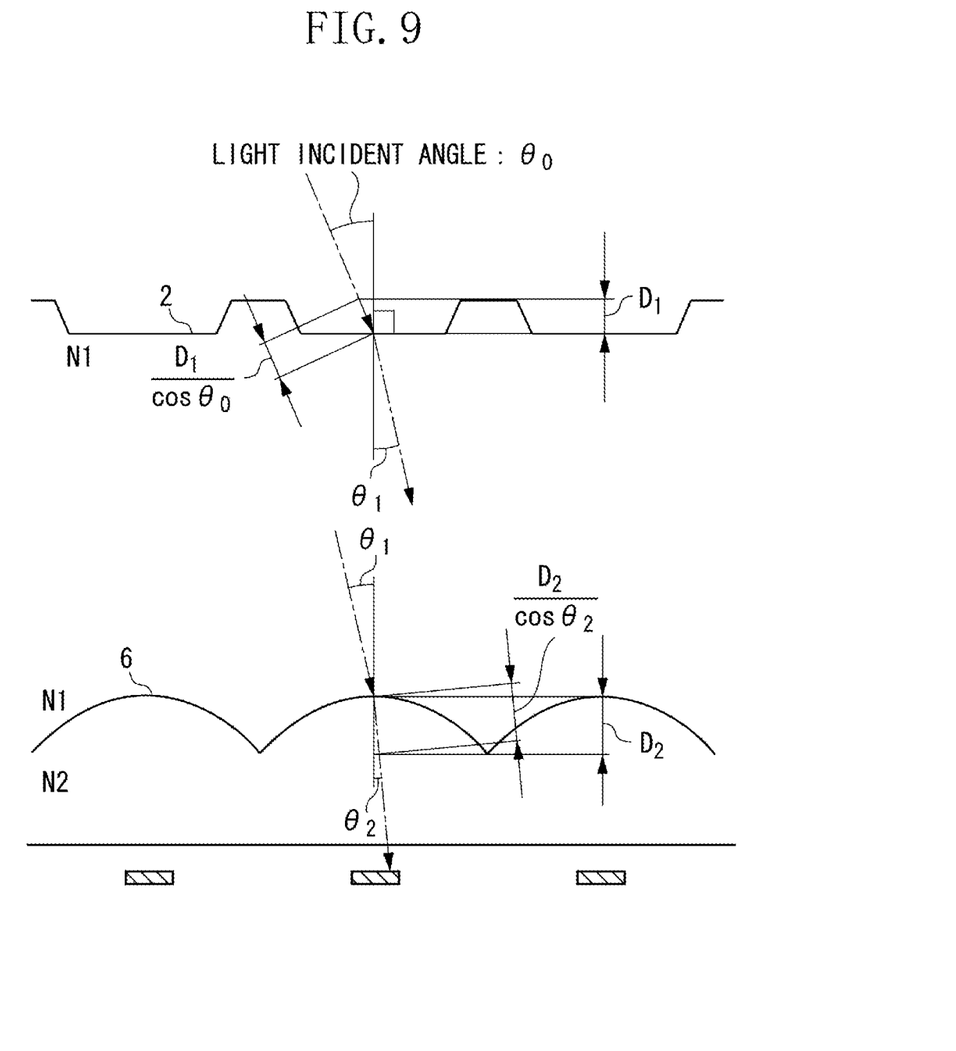
FIG. 9 is a diagram illustrating a case where an incidence condition to an image sensor is changed according to a sixth exemplary embodiment of the present invention.
Figure 10:
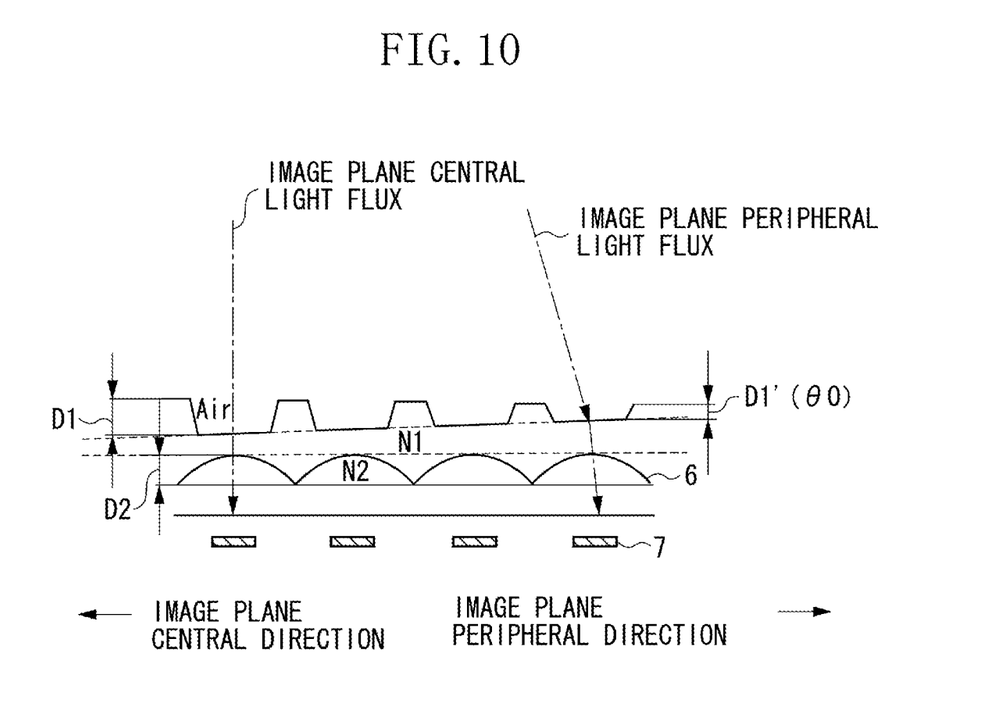
FIG. 10 is a diagram illustrating an image sensor according to the sixth exemplary embodiment of the present invention.

In the image sensor described in the second exemplary embodiment, a sixth exemplary embodiment of the present invention to which the technical spirit described in the fifth exemplary embodiment is applied is illustrated in FIGS. 9 and 10. Since the technical spirit is similar to that of the FIGS. 7 and 8 according to the fifth exemplary embodiment, the description of the technical spirit is omitted.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2012-094087 filed Apr. 17, 2012, No. 2013-055540 filed Mar. 18, 2013, and No. 2013-078690 filed Apr. 4, 2013, which are hereby incorporated by reference herein in their entirety.

What is claimed is:

1. An image sensor in which each microlens of a microlens array is disposed at a position corresponding to each pixel on a side to which light flux is incident,
   wherein a layer formed of a member different from a member constituting the microlens array is disposed on the side of the microlens array to which light flux is incident,
   wherein a surface of the layer formed of the different member has a phase structure optically-opposite to that of the microlens array, and
   wherein the phase structure of the surface of the layer formed of the different member has negative refractive power.

2. An image sensor in which each microlens of a microlens array is disposed at a position corresponding to each pixel on a side to which light flux is incident,
   wherein a layer formed of a member different from a member constituting the microlens array is disposed on the side of the microlens array to which light flux is incident,
   wherein a surface of the layer formed of the different member has a phase structure optically-opposite to that of the microlens array, and
   wherein the phase structure of the surface of the layer formed of the different member does not have refractive power.

3. The image sensor according to claim 2, wherein the phase structure of the surface of the layer formed of the different member has a rectangular or trapezoidal cross-sectional shape.

4. An image sensor in which each microlens of a microlens array is disposed at a position corresponding to each pixel on a side to which light flux is incident,
   wherein a layer formed of a member different from a member constituting the microlens array is disposed on the side of the microlens array to which light flux is incident,
   wherein a surface of the layer formed of the different member has a phase structure optically-opposite to that of the microlens array, and
   wherein, when a refractive index of the layer formed of the different member is N1, a refractive index of the microlens array is N2, a height of the phase structure of the layer formed of the different member is D1, and a height of the microlens array is D2, N1, N2, D1, and D2 satisfy the following equations (1) and (2):

$$\{(N1-1)/(N1+1)\}^2 - [1-\{(N1-1)/(N1+1)\}^2]^2 \times \{(N2-N1)/(N2+N1)\}^2 < 0.04 \quad (1)$$

$$0.8 \leq (D1 \cdot N1)/D2 \leq 1.20 \quad (2).$$

* * * * *